United States Patent
Haque et al.

(10) Patent No.: US 10,095,437 B2
(45) Date of Patent: Oct. 9, 2018

(54) MEMORY ACCESS CONTROL

(71) Applicant: Intel Corporation, Santa Clara, CA (US)

(72) Inventors: Rezaul Haque, Folsom, CA (US); Lady Nataly Pinilla Pico, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/817,029

(22) Filed: Aug. 3, 2015

(65) Prior Publication Data

US 2017/0038997 A1     Feb. 9, 2017

(51) Int. Cl.
*G06F 12/00* (2006.01)
*G06F 3/06* (2006.01)

(52) U.S. Cl.
CPC .......... *G06F 3/0644* (2013.01); *G06F 3/0619* (2013.01); *G06F 3/0634* (2013.01); *G06F 3/0679* (2013.01); *G06F 3/0688* (2013.01)

(58) Field of Classification Search
None
See application file for complete search history.

(56) References Cited

U.S. PATENT DOCUMENTS

| | | | |
|---|---|---|---|
| 6,378,018 B1* | 4/2002 | Tsern | G06F 13/1694 710/313 |
| 6,701,457 B2 | 3/2004 | Reynolds et al. | |
| 2008/0046997 A1 | 2/2008 | Wang | |
| 2008/0155219 A1* | 6/2008 | Pyeon | G06F 13/4291 711/170 |
| 2008/0162784 A1 | 7/2008 | Obereiner et al. | |
| 2011/0191548 A1 | 8/2011 | Miller et al. | |
| 2012/0233433 A1* | 9/2012 | Grunzke | G11C 7/20 711/170 |
| 2015/0052317 A1* | 2/2015 | Grunzke | G11C 7/20 711/148 |

FOREIGN PATENT DOCUMENTS

JP     2003-303030 A     10/2003

OTHER PUBLICATIONS

International Search Report and Written Opinion issued in PCT Application No. PCT/US2016/040981, dated Oct. 17, 2016, 15 pages.
International Preliminary Report on Patentability and Written Opinion issued in PCT Application No. PCT/US2016/040981, dated Feb. 15, 2018, 12 pages.

* cited by examiner

*Primary Examiner* — Brian Peugh
(74) *Attorney, Agent, or Firm* — Grossman, Tucker, Perreault & Pfleger, PLLC

(57) ABSTRACT

The present disclosure relates to memory array access control. An apparatus includes partition control circuitry to control at least one partition of a memory array, the at least one partition control circuitry also to receive a controlled clock signal to enable execution of a legitimate memory access command and to generate an active/idle signal having an active state when executing the legitimate memory access command and an idle state when executing the legitimate memory access command is complete; wherein the clock signal is disabled when the active/idle signal is in an idle state.

22 Claims, 4 Drawing Sheets

MEMORY ACCESS CONTROL

FIELD

The present disclosure relates to memory access control.

BACKGROUND

Unwanted memory commands have the ability to corrupt data, which may cause failures at the application and system level. Protection of data in a memory array has been proposed using various complex schemes which increase the cost and complexity of the system. At a system level, maintaining voltage sequences are costly when a system shutdown happens because power management is needed to manage these situations. But, without power management, there is always the potential that array data within memory component may be corrupted, for example, during an unsequenced power shutdown

BRIEF DESCRIPTION OF DRAWINGS

Features and advantages of the claimed subject matter will be apparent from the following detailed description of embodiments consistent therewith, which description should be considered with reference to the accompanying drawings, wherein:

Although the following Detailed Description will proceed with reference being made to illustrative embodiments, many alternatives, modifications, and variations thereof will be apparent to those skilled in the art.

DETAILED DESCRIPTION

Generally, this disclosure describes a system and method for data protection in a memory array. In some embodiments, the memory array is segmented into a plurality of partitions. At least one partition control circuit is provided that controls memory access and/or power management for at least one partition. The at least one partition control circuit is configured to generate an active/idle state signal indicative of whether the partition control circuitry is in an idle/low-power state or in an operational (memory access) state. Memory controller circuitry is configured to receive the state signal from the partition control circuitry and control a clock signal to the partition control circuitry. The memory controller circuitry is also configured to receive a memory access command that may be legitimate or illegitimate. A legitimate command may include, for example, memory read/write commands, force read command, reset only write command, etc. Illegitimate commands include unwanted and/or spurious commands that may corrupt data in the array, and may include, for example, voltage coupling, power sequence operations, etc. If the command is legitimate, the memory controller may enable the clock signal for the partition control circuit to enable the partition control circuit to decode and process the legitimate command. While processing the legitimate command, the partition control circuit may change the state of the state signal to indicate an active state, and once completed, may change the state signal to indicate an idle state, so that the memory controller circuitry can decouple, or gate, the clock signal from the partition control circuit. Advantageously, this may enable the array partition to enter an idle and/or low power state while being protected from illegitimate commands.

Figure 1:
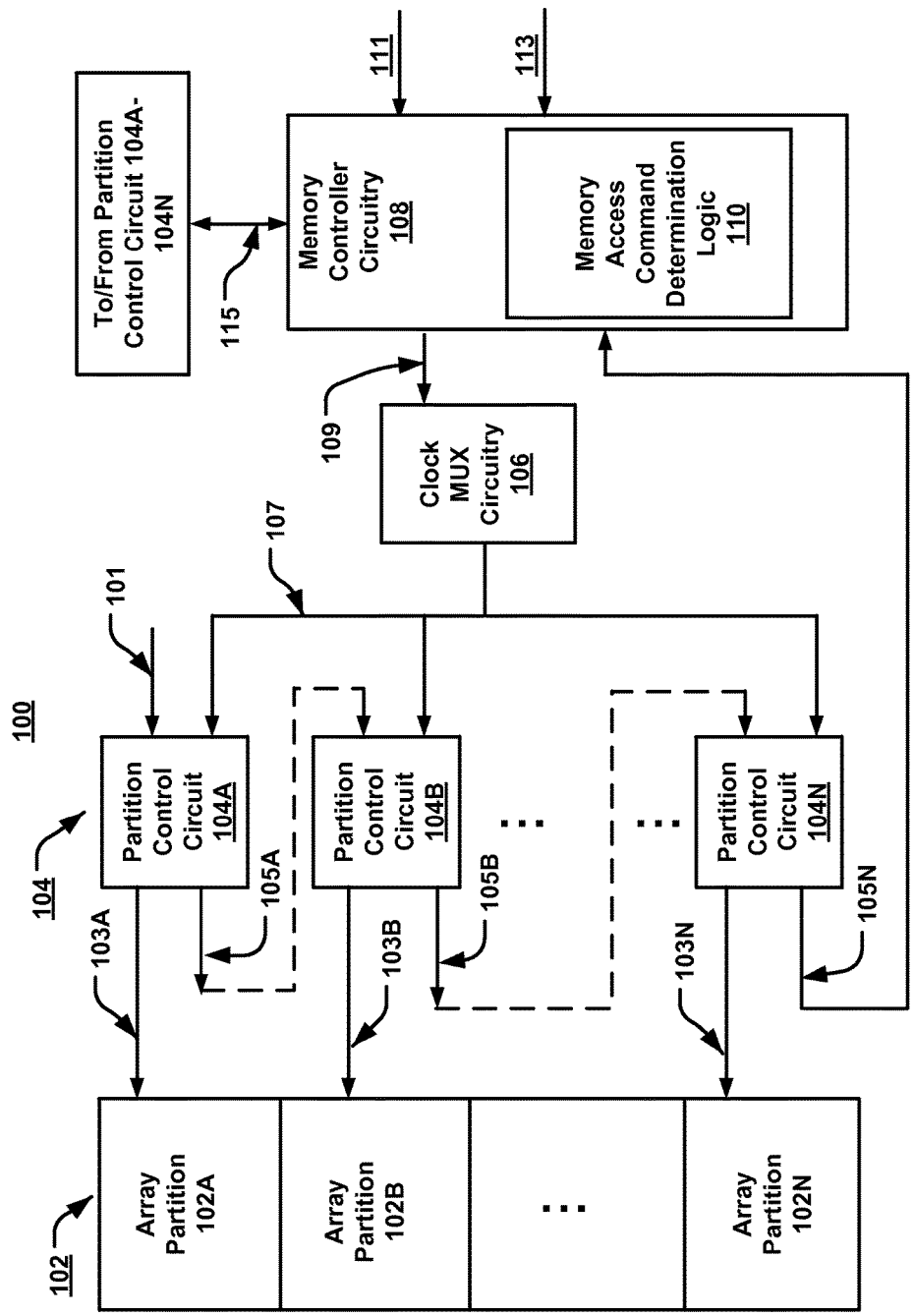
FIG. 1 illustrates a system block diagram, consistent with several embodiments of the present disclosure.

FIG. 1 illustrates a system block diagram 100 consistent with several embodiments of the present disclosure. The system 100 includes a memory array 102, partition control circuitry 104 that includes a plurality of partition control circuits 104A, 104B, . . . , 104N, clock multiplexing (MUX) circuitry 106 and memory controller circuitry 108. In the embodiments described herein, the memory array 102 may be segmented (logically and/or physically) into a plurality of partitions (e.g., plurality of "panels" or "tiles", etc.) 102A, 102B, . . . , 102N. The size of each memory partition 102A, 102B, . . . , 102N may be based on, for example, the size of the overall array 102, memory addresses, physical location of memory structures, etc. Memory array 102 may include non-volatile memory structures (e.g., phase change or cross-point memory, etc.) and/or volatile memory such as random access memory, cache memory, etc. In some embodiments, partition control circuits 104A, 104B, . . . , 104N are provided to control (e.g., read/write access control, power management control, etc.) of a respective partition 102A, 102B, . . . , 102N of the memory array 102. In other embodiments, a partition control circuit, e.g., partition control circuitry 104A may control more than one memory partition, e.g., partitions 102A and 102B, and thus there may be less than N number of individual partition control circuits. Memory controller circuitry 108 is generally configured to receive a memory access command 113 and control application of a clock signal 109 to at least one partition control circuit 104A, 104B, . . . , 104N, as will be described below. The memory access command 113 may be generated by, for example, a central processing unit (e.g., system CPU, not shown) and/or subset thereof (e.g., one or more cores of a system CPU, etc., not shown) executing one or more applications (also not shown) which require access to memory array 102.

In one embodiment, partition control circuit 104A, 104B, . . . , 104N are each configured to generate and propagate an active/idle signal 105A, 105B, . . . , 105N. The active/idle signal 105A, 105B, . . . , 105N is indicative of the state of at least one partition control circuit 104A, 104B, . . . , 104N. The "state", as used herein, means either an active state in which at least one partition control circuit 104A, 104B, . . . , and/or 104N is decoding and/or processing a legitimate memory access command, or an idle/low-power state in which the partition control circuit 104A, 104B, . . . , and/or 104N is gated from memory controller circuitry 108. In one embodiment, the first partition control circuit 104A is configured to receive an idle signal 101 and propagate the idle signal as the active/idle signal 105A if the partition control circuit 104A is not processing a memory access command. The idle signal 101 may include, for example, an available reference voltage (e.g., Vcc, etc.). If any of the partition control circuits 104A, 104B, . . . , and/or 104N is in an active state, that partition control circuit is configured to change the state of the active/idle signal 105A, 105B, . . . , and/or 105N to indicate an active state. The last partition control circuit 104N is configured to transmit the active/idle signal 105N to the memory controller circuitry 108. Since any of the partition control circuits 104A, 104B, . . . , and/or 104N can change the state of a respective active/idle signal 105A, 105B, . . . , and/or 105N, the last active/idle signal 105N is indicative of all partition control circuits 104A, 104B, . . . , and 104N being in an idle/low-power state, or at least one partition control circuit 104A, 104B, . . . , and/or 104N being in an active state. In another embodiment, instead of propagating a respective active/idle signal 105A, 105B, . . . , 105N through each partition control circuitry 104A, 104B, . . . , 104N, each active/idle signal 105A, 105B, . . . , 105N may be transmitted directly to memory controller circuitry 108, at the possible expense of additional pinout requirements and/or bus and bus control requirements.

The memory controller circuitry 108 is generally configured to gate the application of clock signal 109 to at least one partition control circuit 104A, 104B, . . . , and/or 104N based on, at least in part, the type of memory access command 113 received by the memory controller circuitry 108. As described above, a memory access command 113 may generally be legitimate or illegitimate. Accordingly, memory controller circuitry 108 may also include memory access command determination logic 110 generally configured to determine if a memory access command 113 is legitimate or illegitimate. To that end, memory access command determination logic 110 may be configured to parse an incoming memory access command to determine certain features of the command that trend to demonstrate that the memory access command 113 is legitimate or illegitimate. Features that may demonstrate that the memory access command 113 is legitimate include, for example, command decode information, proper clock signaling, etc. while features that may demonstrate that the memory access command 113 is illegitimate include, for example, voltage coupling, power sequence operations, etc. Memory controller circuitry 108 may remain in a low power/idle state in the absence of a memory access command 113.

If a memory access command 113 is determined to be legitimate, memory controller circuitry 108 is configured to turn on a clock signal 109 to enable at least one partition control circuit 104A, 104B, . . . , and/or 104N to decode and/or process the memory access command 113. The clock signal 109 may include a clock signal 111 received from a system clock generator (not shown), etc., and may further include a clock signal 111 from a different clock domain. The clock MUX circuitry 106 is generally configured to receive a clock signal 109 and route a similar clock signal 107 to at least one partition control circuit 104A, 104B, . . . , and/or 104N, depending on, for example, address information identified in the memory access command 113. In some embodiments, clock MUX circuitry 106 is configured to route the clock signal 107 only to the partition control circuit 104A, 104B, . . . , and/or 104N that will be processing (or is processing) the memory access command 113. Once the clock signal 107 is applied to one or more of the partition control circuitry 104A, 104B, . . . , and/or 104N, memory controller may transmit a wake up signal, via bus 115, to the place the appropriate partition control circuitry 104A, 104B, . . . , and/or 104N in a condition to receive and process (decode) the memory access command 113. Once the appropriate partition control circuit 104A, 104B, . . . , and/or 104N is in a state that is ready to process (which may be verified by a wake-up handshake signal, etc.), the memory access command 113 may be transmitted to the appropriate partition control circuit 104A, 104B, . . . , and/or 104N for decoding/processing, via bus 115. Data associated with the memory access command 113 and any data results from the memory access command (e.g., read results) may be transmitted between the memory controller circuitry 108 and the appropriate partition control circuit 104A, 104B, . . . , and/or 104N, via bus 115.

As described above, if at least one partition control circuit 104A, 104B, . . . , and/or 104N is processing a memory access command 113, the state of the active/idle signal 105A, 105B, . . . , and/or 105N may indicate an active state. Accordingly, memory controller circuitry 108 is configured to enable the clock signal 109 for as long as the active/idle signal 105A, 105B, . . . , and/or 105N indicates an active state. Once any or all of the circuits 104A, 104B, . . . , and/or 104N has completed processing of a memory access command 113, and the corresponding the active/idle signal 105A, 105B, . . . , and/or 105N changes state from active to idle, memory controller circuitry 108 is configured to disable (e.g., gate) the clock signal 109 (and correspondingly, clock signal 107) to the appropriate circuitry 104A, 104B, . . . , and/or 104N. More than one legitimate memory access command 113 for a particular partition 102A, 102B, . . . , and/or 102N may be received by memory controller circuitry 108. In such a case, memory controller circuitry 108 may be configured to queue the memory access commands 113 and maintain the clock signal until all such commands have been executed. This may reduce lag time associated with waking up of partition control circuit 104A, 104B, . . . , and/or 104N between memory access commands 113. If memory access command determination logic 110 determines that a memory access command 113 is illegitimate, the memory controller circuitry may keep the clock signal 109 disabled for all or any of the partition control circuits 104A, 104B, . . . , and/or 104N. In some embodiments, memory controller circuitry 108 may be configured to generate a signal that indicates that the received memory access command 113 is illegitimate. Thus, partition control circuitry 104A, 104B, . . . , and/or 104N and/or corresponding partitions 102A, 102B, . . . , and/or 102N may enter a low power state and may be protected from spurious and/or unwanted (illegitimate) memory access commands.

Figure 2:
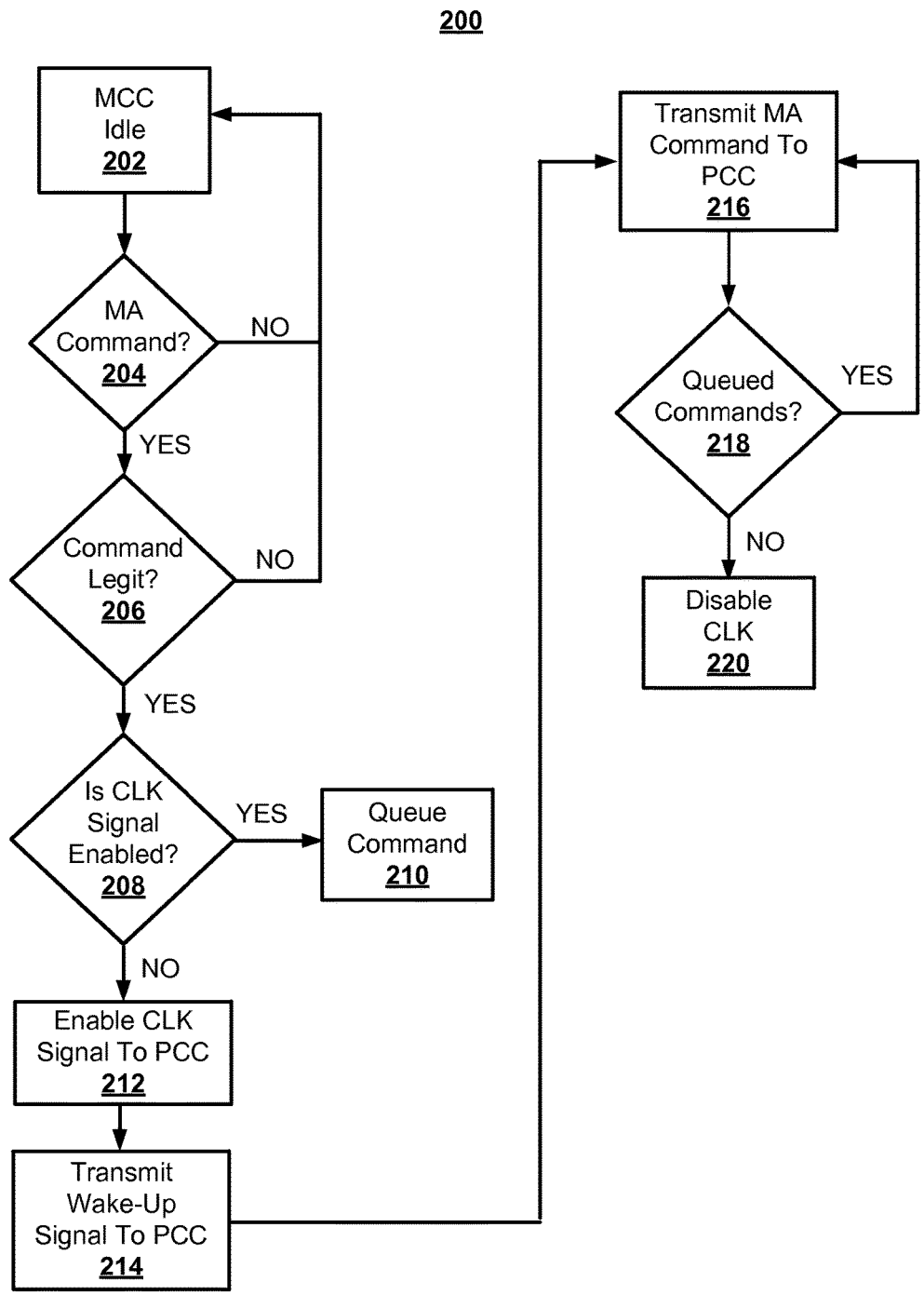
FIG. 2 illustrates a flowchart of operations of memory controller circuitry consistent with one embodiment of the present disclosure.

FIG. 2 illustrates a flowchart 200 of operations of memory controller circuitry consistent with one embodiment of the present disclosure. The operations may be performed, for example, by memory controller circuitry 108 (FIG. 1) and/or other memory controller circuitry. Operations of this embodiment include maintaining memory controller circuitry (MCC) in an idle state 202, and determining if a memory access (MA) command is received 204. If no MA is received 204, operations may include maintaining the MCC in an idle state 202. If a MA command is received (204), operations may also include determining if the MA command is legitimate 206. If the MA command is not legitimate (illegitimate) (206), operations may include operations may include maintaining the MCC in an idle state 202. If the MA command is legitimate (206), operations may include determining if a clock (CLK) signal is enabled 208, and if so (indicating that a current MA command is being executed), queuing the MA command 208 to be performed after the current command operations are complete. If the CLK signal is not enabled (208), operations may include enabling the CLK signal to at least one partition control circuit (PCC) 212. Operations may also include transmitting a wake-up signal to the at least one PCC 214. The wake-up signal may be a handshake and/or other signal type to enable the PCC to transition from a low-power and/or idle state to an active state. Operations may include transmitting the MA command to the PCC 216. Operations may also include determining if there are any queued MA commands 218, and if so, transmitting the queued commands to the PCC 216, thus avoiding unnecessary clock cycling and/or wake-up transitions. Once the MA command is completed by the at least one PCC (and once any results have been transmitted to the MCC), operations may also include disabling the CLK signal 220, to permit, for example, the PCC to transition to a low-power state and to gate illegitimate memory access commands.

Figure 3:
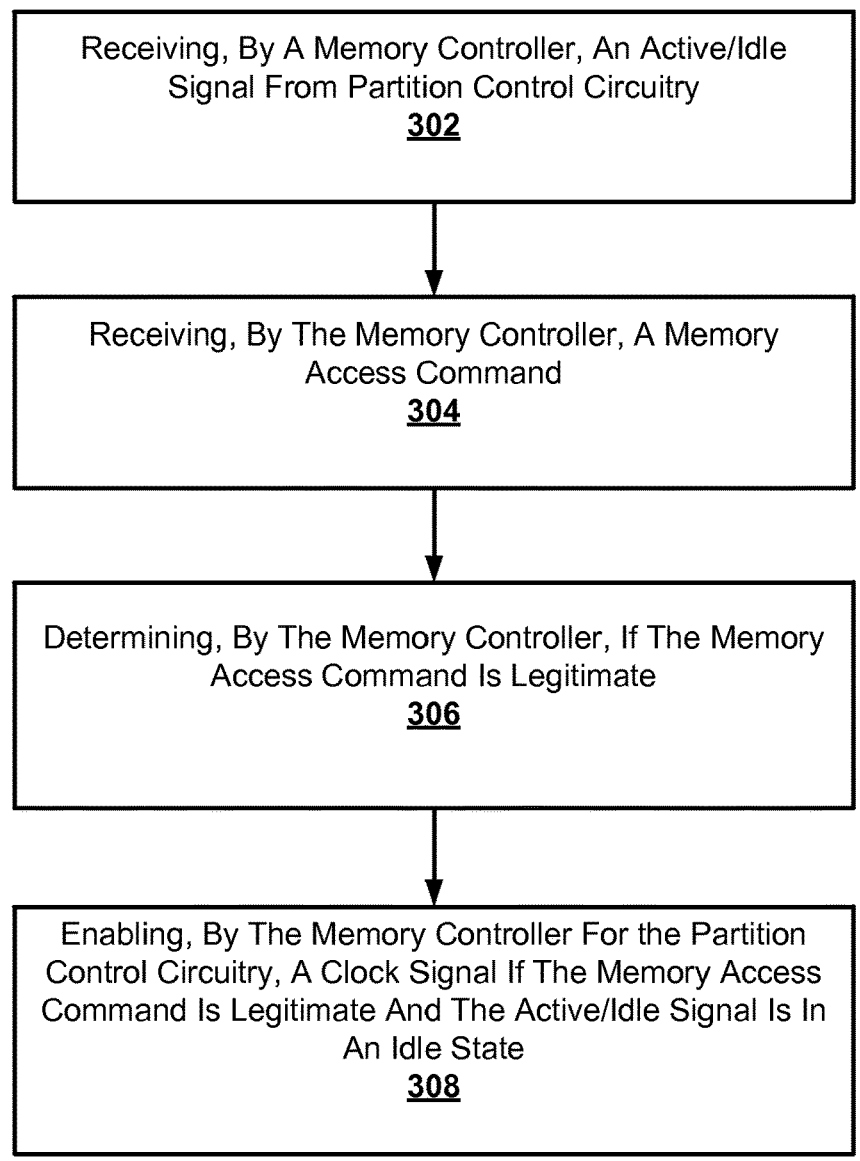
FIG. 3 illustrates a flowchart of operations of memory controller circuitry consistent with another embodiment of the present disclosure.

FIG. 3 illustrates a flowchart 300 of operations of memory controller circuitry consistent with another embodiment of the present disclosure. The operations may be performed, for example, by memory controller circuitry 108 (FIG. 1) and/or other memory controller circuitry. Operations of this embodiment include receiving, by a memory controller, an active/idle signal from a partition control circuit 302. The partition control circuit controls at least one partition of a memory array, and the active/idle signal has a state indicative of one of an active state or an idle state of the partition control circuit. Operations may also include receiving, by the memory controller, a memory access command 304. Operations may also include determining, by the memory controller, if the memory access command is legitimate 306. Operations may also include enabling, by the memory controller for the partition control circuit, a clock signal if the memory access command is legitimate and the active/idle signal is in an idle state 308.

Figure 4:
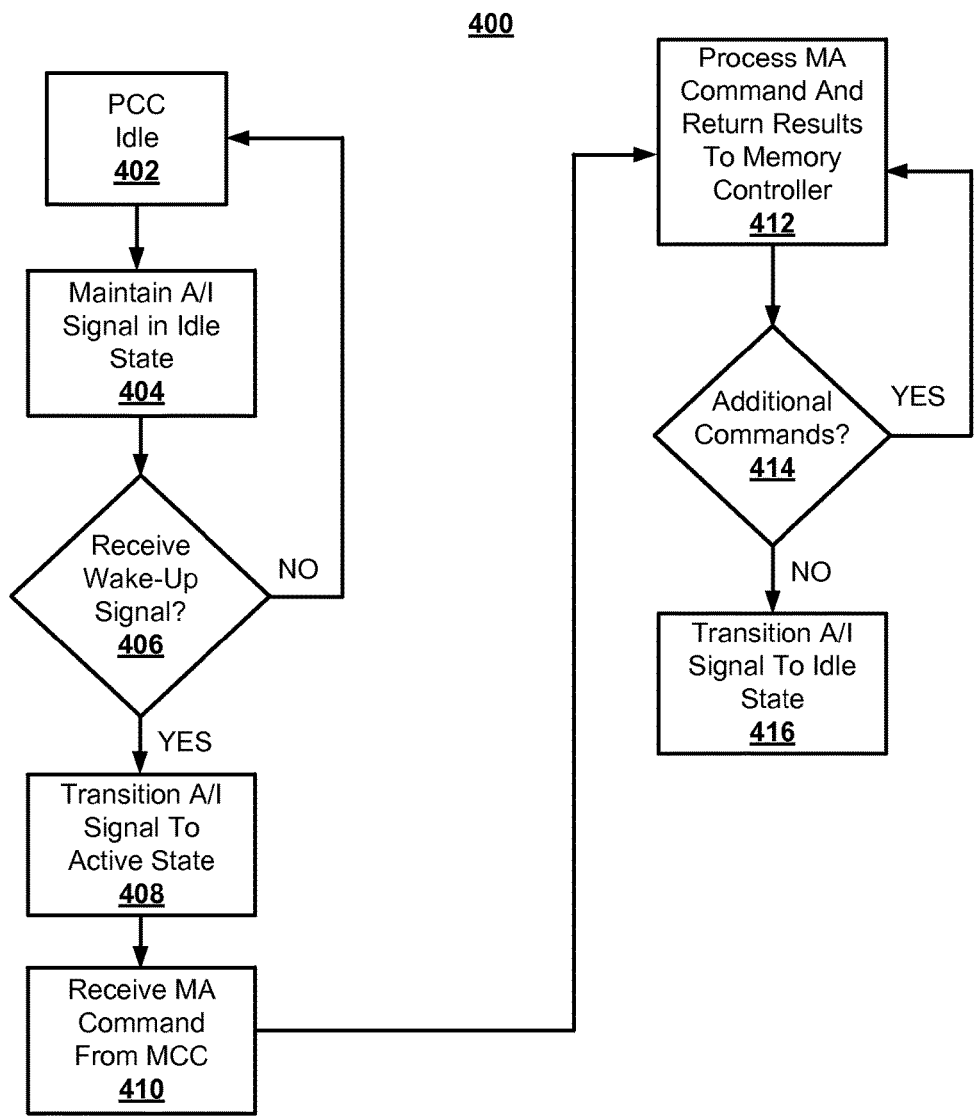
FIG. 4 illustrates a flowchart of operations of partition control circuitry consistent with one embodiment of the present disclosure.

FIG. 4 illustrates a flowchart 400 of operations of partition control circuitry consistent with one embodiment of the present disclosure. The operations may be performed, for example, by partition control circuit, e.g., circuit 104A (FIG. 1) and/or other circuitry associated with a partition of a memory array. Operations of this embodiment include maintaining the partition control circuit (PCC) in an idle and/or low-power state 402. Operations may also include maintaining an active/idle (A/I) signal in an idle state 404. Operations may also include determining, by the PCC, if a wake-up signal has been received 406. The wake-up signal may be generated by, for example, a memory controller to enable the PCC to transition from an idle state to an active state. If no wake-up signal is received (406) the PCC may remain in an idle state 402. If a wake-up signal is received (406), operations may include transitioning the A/I signal to an active state 408 and receiving a memory access (MA) command 410 from, for example, the memory controller. Operations may also include processing the MA command and returning any results to the memory controller 412. Operations may also include determining if there are any additional MA commands 414, and if so processing those commands 412. Once all commands have been processed, operations may also include transitioning the A/I signal to an idle state 416.

While FIGS. 2-4 illustrate various operations according to various embodiments, it is to be understood that not all of the operations depicted in FIG. 2, 3 or 4 are necessary for other embodiments. Indeed, it is fully contemplated herein that in other embodiments of the present disclosure, the operations depicted in FIGS. 2, 3 and/or 4, and/or other operations described herein may be combined in a manner not specifically shown in any of the drawings, but still fully consistent with the present disclosure. Thus, claims directed to features and/or operations that are not exactly shown in one drawing are deemed within the scope and content of the present disclosure.

As used in any embodiment herein, the term "logic" may refer to an application, software, firmware and/or circuitry configured to perform any of the aforementioned operations. Software may be embodied as a software package, code, instructions, instruction sets and/or data recorded on non-transitory computer readable storage device. Firmware may be embodied as code, instructions or instruction sets and/or data that are hard-coded (e.g., nonvolatile) in memory devices. "Circuitry" and "circuitry", as used in any embodiment herein, may comprise, for example, singly or in any combination, hardwired circuitry, programmable circuitry such as computer processors comprising one or more individual instruction processing cores, state machine circuitry, and/or firmware that stores instructions executed by programmable circuitry. The circuitry may include a processor and/or controller configured to execute one or more instructions to perform one or more operations described herein. The instructions may be embodied as, for example, an application, software, firmware, etc. configured to cause the circuitry to perform any of the aforementioned operations. Software may be embodied as a software package, code, instructions, instruction sets and/or data recorded on a computer-readable storage device. Firmware may be embodied as code, instructions or instruction sets and/or data that are hard-coded (e.g., nonvolatile) in memory devices. The circuitry may, collectively or individually, be embodied as circuitry that forms part of a larger system, for example, an integrated circuit (IC), an application-specific integrated circuit (ASIC), a system on-chip (SoC), desktop computers, laptop computers, tablet computers, servers, smart phones, etc.

Any of the operations described herein may be implemented in a system that includes one or more storage devices having stored thereon, individually or in combination, instructions that when executed by one or more processors perform one or more operations. Also, it is intended that operations described herein may be distributed across a plurality of physical devices, such as processing structures at more than one different physical location. The storage devices may include any type of tangible device, for example, any type of disk including hard disks, floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, Solid State Disks (SSDs), magnetic or optical cards, or any type of media suitable for storing electronic instructions. Other embodiments may be implemented as software executed by a programmable control device. As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Reference throughout this specification to "one embodiment" or "an embodiment" means that a particular feature, structure, or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In some embodiments, a hardware description language may be used to specify circuit and/or logic implementation(s) for the various modules and/or circuitry described herein. For example, in one embodiment the hardware description language may comply or be compatible with a very high speed integrated circuits (VHSIC) hardware description language (VHDL) that may enable semiconductor fabrication of one or more circuits and/or modules described herein. The VHDL may comply or be compatible with IEEE Standard 1076-1987, IEEE Standard 1076.2, IEEE1076.1, IEEE Draft 3.0 of VHDL-2006, IEEE Draft 4.0 of VHDL-2008 and/or other versions of the IEEE VHDL standards and/or other hardware description standards.

EXAMPLES

Examples of the present disclosure include subject material such as a method, means for performing acts of the method, a device, or of an apparatus or system related to controlling access to a memory array, as provided below.

Example 1

According to this example there is provided an apparatus. The apparatus includes partition control circuitry to control at least one partition of a memory array, the partition control circuitry also to receive a controlled clock signal to enable execution of a legitimate memory access command and to generate an active/idle signal having an active state during execution of the legitimate memory access command or having an idle state in response to completion of execution of the legitimate memory access command.

Example 2

This example includes the elements of example 1, wherein the legitimate memory access command includes a command includes at least one of a read command, a write command, a force write command and a reset only write command.

Example 3

This example includes the elements of example 1, wherein the partition control circuitry also to receive a wake-up command to transition the partition control circuitry from an idle state to an active state.

Example 4

This example includes the elements according to any one of examples 1 through 3, wherein the partition control circuitry includes a plurality of partition control circuits each to control a respective partition of the memory array, and wherein each partition control circuit to generate a respective active/idle signal.

Example 5

This example includes the elements according to example 4, wherein each partition control circuit to propagate a respective active/idle signal from a previous partition control circuit to a subsequent partition control circuit, and wherein a last partition control circuit is configured to transmit the active/idle signal indicative of an active or idle state of at least one partition control circuit.

Example 6

According to this example there is provided a method. This method includes receiving, by a memory controller, an active/idle signal from partition control circuitry; wherein the partition control circuitry to control at least one partition of a memory array and wherein the active/idle signal has a state indicative of one of an active state or an idle state of the partition control circuitry; receiving, by the memory controller, a memory access command; determining, by the memory controller, if the memory access command is legitimate; and enabling, by the memory controller for the partition control circuitry, a clock signal if the memory access command is legitimate and if the active/idle signal is in an idle state.

Example 7

This example includes the elements according to example 6, wherein the determining, by the memory controller, if the memory access command is legitimate includes parsing the memory access command to discover that the command includes at least one of a read command, a write command, a force write command and a reset only write command.

Example 8

This example includes the elements according to example 6, further comprising determining, by the memory controller, if the memory access command is illegitimate by parsing the memory access command to determine if the memory access command includes a voltage coupling or a power sequence operation.

Example 9

This example includes the elements according to example 6, further comprising: determining, by the memory controller, if the clock signal is enabled from a previous memory access command; and queuing the memory access command if the clock signal is enabled.

Example 10

This example includes the elements according to example 6, further comprising transmitting a wake-up signal to the partition control circuitry to enable the partition control circuitry to transition from an idle state to an active state.

Example 11

According to this example there is provided a system for memory access control. The system includes memory controller circuitry to receive a memory access command and determine if the memory access command is legitimate or illegitimate, and to enable a clock signal if the memory access command is legitimate; and partition control circuitry to control at least one partition of a memory array, the partition control circuitry also to receive a controlled clock signal to enable execution of a legitimate memory access command and to generate an active/idle signal having an active state during execution of the legitimate memory access command or having an idle state in response to completion of execution of the legitimate memory access command; wherein the memory controller circuitry to disable the clock signal to the at least one partition control circuitry when the active/idle signal is in an idle state.

Example 12

This example includes the elements according to example 11, wherein the memory controller circuitry also to parse the memory access command to discover if the memory access command includes at least one of a read command, a write command, a force write command and a reset only write command.

Example 13

This example includes the elements according to example 11, wherein the memory controller circuitry also to parse the memory access command to determine if the memory access command includes a voltage coupling or a power sequence operation.

Example 14

This example includes the elements according to example 11, wherein the memory controller also to determine if the clock signal is enabled from a previous memory access command; and to queue the memory access command if the clock signal is enabled.

Example 15

This example includes the elements according to example 11, wherein the memory controller also to transmit a wake-up signal to the partition control circuitry to enable the partition control circuitry to transition from an idle state to an active state.

Example 16

This example includes the elements according to example 11, wherein the partition control circuitry includes a plurality of partition control circuits each to control a respective partition of the memory array, and wherein each partition control circuit to generate a respective active/idle signal.

Example 17

This example includes the elements according to example 16, wherein each partition control circuit to propagate a respective active/idle signal from a previous partition control circuit to a subsequent partition control circuit, and wherein a last partition control circuit is configured to transmit the active/idle signal to the memory controller circuitry.

Example 18

This example includes the elements according to example 16, further comprising: clock multiplexor circuitry to route the clock signal to a partition control circuit to execute the at least one memory access command.

Example 19

According to this example there is provided a computer-readable storage device having stored thereon instructions that when executed by one or more processors result in the following operations comprising: receive, by a memory controller, an active/idle signal from partition control circuitry; wherein the partition control circuitry to control at least one partition of a memory array and wherein the active/idle signal has a state indicative of one of an active state or an idle state of the partition control circuitry; receive, by the memory controller, a memory access command; determine, by the memory controller, if the memory access command is legitimate; and enable, by the memory controller for the partition control circuitry, a clock signal if the memory access command is legitimate and if the active/idle signal is in an idle state.

Example 20

This example includes the elements of example 19, wherein the instructions result in the following additional operations comprising: parse the memory access command to discover if the memory access command includes at least one of a read command, a write command, a force write command and a reset only write command.

Example 21

This example includes the elements of example 19, wherein the instructions result in the following additional operations comprising: parse the memory access command to determine if the memory access command includes a voltage coupling or a power sequence operation.

Example 22

This example includes the elements of example 19, wherein the instructions result in the following additional operations comprising: determine if the clock signal is enabled from a previous memory access command; and queue the memory access command if the clock signal is enabled.

Example 23

This example includes the elements of example 19, wherein the instructions result in the following additional operations comprising: transmit a wake-up signal to the partition control circuitry to enable the partition control circuitry to transition from an idle state to an active state.

Example 24

This example includes a computer readable storage device having stored thereon instructions that when executed by one or more processors result in the following operations including:
the method according to any one of example 6 to 10.

Example 25

This example includes a system including at least one device arranged to perform the method of any one of examples 6 to 10.

Example 26

This example includes a device that includes means to perform the method of any one of examples 6 to 10.

Example 27

According to this example there is provided an apparatus to control access to a memory array. The apparatus includes a memory controller to receive a memory access command and determine if the memory access command is legitimate or illegitimate; and to enable a clock signal to at least a portion of a memory array if the memory access command is legitimate; and to receive an active/idle signal associated with at least one portion of a memory array, the active/idle signal having an active state when the at least one portion of the memory array is executing the legitimate memory access command and an idle state when executing the legitimate memory access command is complete; wherein the memory controller to disable the clock signal to the at least one portion of the memory array when the active/idle signal is in an idle state.

Example 28

This example includes the elements of example 27, wherein the memory controller also to parse the memory access command to discover if the memory access command includes at least one of a read command, a write command, a force write command and a reset only write command.

Example 29

This example includes the elements of example 27, wherein the memory controller circuitry also to parse the memory access command to determine if the memory access command includes a voltage coupling or a power sequence operation.

Example 30

This example includes the elements of example 27, wherein the memory controller also to determine if the clock signal is enabled from a previous memory access command; and to queue the memory access command if the clock signal is enabled.

Example 31

This example includes the elements of example 27, wherein the memory controller also to transmit a wake-up signal to the at least one portion of the memory array to enable the at least one portion of the memory array to transition from an idle state to an active state.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. An apparatus comprising:
   partition control circuitry to control at least one partition of a memory array, the partition control circuitry also to receive a controlled clock signal to enable execution of a legitimate memory access command and to provide an active/idle signal having an active state during execution of the legitimate memory access command or having an idle state in response to completion of execution of the legitimate memory access command.

2. The apparatus of claim 1, wherein the legitimate memory access command includes at least one of a read command, a write command, a force write command and a reset only write command.

3. The apparatus of claim 1, wherein the partition control circuitry also to receive a wake-up command to transition the partition control circuitry from an idle state to an active state.

4. The apparatus of claim 1, wherein the partition control circuitry includes a plurality of partition control circuits each to control a respective partition of the memory array, and wherein each partition control circuit to provide a respective active/idle signal.

5. The apparatus of claim 4, wherein each partition control circuit to propagate a respective active/idle signal from a previous partition control circuit to a subsequent partition control circuit, and wherein a last partition control circuit is configured to transmit the active/idle signal indicative of an active or idle state of at least one partition control circuit.

6. A method comprising:
   receiving, by a memory controller, an active/idle signal from partition control circuitry; wherein the partition control circuitry to control at least one partition of a memory array and wherein the active/idle signal has a state indicative of one of an active state or an idle state of the partition control circuitry;
   receiving, by the memory controller, a memory access command;
   determining, by the memory controller, if the memory access command is legitimate; and
   enabling, by the memory controller for the partition control circuitry, a clock signal if the memory access command is legitimate and if the active/idle signal is in an idle state.

7. The method of claim 6, wherein the determining, by the memory controller, if the memory access command is legitimate includes parsing the memory access command to discover if the memory access command includes at least one of a read command, a write command, a force write command and a reset only write command.

8. The method of claim 6, further comprising determining, by the memory controller, if the memory access command is illegitimate by parsing the memory access command to determine if the memory access command includes a voltage coupling or a power sequence operation.

9. The method of claim 6, further comprising:
   determining, by the memory controller, if the clock signal is enabled from a previous memory access command; and
   queuing the memory access command if the clock signal is enabled.

10. The method of claim 6, further comprising transmitting a wake-up signal to the partition control circuitry to enable the partition control circuitry to transition from an idle state to an active state.

11. A system comprising:
    memory controller circuitry to receive a memory access command and determine if the memory access command is legitimate or illegitimate, and to enable a clock signal if the memory access command is legitimate; and
    partition control circuitry to control at least one partition of a memory array, the partition control circuitry also to receive a controlled clock signal to enable execution of a legitimate memory access command and to provide an active/idle signal having an active state during execution of the legitimate memory access command or having an idle state in response to completion of execution of the legitimate memory access command;

wherein the memory controller circuitry to disable the clock signal to the partition control circuitry when the active/idle signal is in an idle state.

12. The system of claim 11, wherein the memory controller circuitry also to parse the memory access command to discover if the memory access command includes at least one of a read command, a write command, a force write command and a reset only write command.

13. The system of claim 11, wherein the memory controller circuitry also to parse the memory access command to determine if the memory access command includes a voltage coupling or a power sequence operation.

14. The system of claim 11, wherein the memory controller circuitry also to determine if the clock signal is enabled from a previous memory access command; and to queue the memory access command if the clock signal is enabled.

15. The system of claim 11, wherein the memory controller circuitry also to transmit a wake-up signal to the partition control circuitry to enable the partition control circuitry to transition from an idle state to an active state.

16. The system of claim 11, wherein the partition control circuitry includes a plurality of partition control circuits each to control a respective partition of the memory array, and wherein each partition control circuit to provide a respective active/idle signal.

17. The system of claim 16, wherein each partition control circuit to propagate a respective active/idle signal from a previous partition control circuit to a subsequent partition control circuit, and wherein a last partition control circuit is configured to transmit the active/idle signal to the memory controller circuitry.

18. A computer-readable storage device having stored thereon instructions that when executed by one or more processors result in the following operations comprising:
  receive, by a memory controller, an active/idle signal from partition control circuitry; wherein the partition control circuitry to control at least one partition of a memory array and wherein the active/idle signal has a state indicative of one of an active state or an idle state of the partition control circuitry;
  receive, by the memory controller, a memory access command;
  determine, by the memory controller, if the memory access command is legitimate; and
  enable, by the memory controller for the partition control circuitry, a clock signal if the memory access command is legitimate and if the active/idle signal is in an idle state.

19. The computer-readable storage device of claim 18, wherein the instructions result in the following additional operations comprising:
  parse the memory access command to discover if the memory access command includes at least one of a read command, a write command, a force write command and a reset only write command.

20. The computer-readable storage device of claim 18, wherein the instructions result in the following additional operations comprising:
  parse the memory access command to determine if the memory access command includes a voltage coupling or a power sequence operation.

21. The computer-readable storage device of claim 18, wherein the instructions result in the following additional operations comprising:
  determine if the clock signal is enabled from a previous memory access command; and queue the memory access command if the clock signal is enabled.

22. The computer-readable storage device of claim 18, wherein the instructions result in the following additional operations comprising:
  transmit a wake-up signal to the partition control circuitry to enable the partition control circuitry to transition from an idle state to an active state.

* * * * *